(12) United States Patent
Roeckel et al.

(10) Patent No.: US 7,024,943 B2
(45) Date of Patent: Apr. 11, 2006

(54) DEVICE CONSISTING AT LEAST OF TWO PARTS JOINED TOGETHER

(75) Inventors: Herbert Roeckel, Ditzingen (DE); Rainer Schard, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/398,599

(22) PCT Filed: Jun. 12, 2002

(86) PCT No.: PCT/DE02/02149

§ 371 (c)(1),
(2), (4) Date: Oct. 21, 2003

(87) PCT Pub. No.: WO03/017741

PCT Pub. Date: Feb. 27, 2003

(65) Prior Publication Data

US 2004/0060364 A1    Apr. 1, 2004

(30) Foreign Application Priority Data

Aug. 4, 2001   (DE) .............................. 101 38 482

(51) Int. Cl.
*G01N 3/02* (2006.01)

(52) U.S. Cl. ....................................................... 73/850
(58) Field of Classification Search .................. 73/861, 73/861.52, 861.58, 849, 850
See application file for complete search history.

(56) References Cited

U.S. PATENT DOCUMENTS

| 4,825,705 A | * | 5/1989 | Hohloch et al. ....... 73/861.355 |
| 5,804,718 A | | 9/1998 | Nagasaka et al. |
| 6,585,662 B1 | * | 7/2003 | Jones et al. .............. 73/861.52 |

FOREIGN PATENT DOCUMENTS

| DE | 41 35 876 | 5/1993 |
| DE | 196 10 885 | 9/1997 |
| GB | 2 047 409 | 11/1980 |
| GB | 2 314 902 | 1/1998 |

* cited by examiner

Primary Examiner—Max Noori
(74) Attorney, Agent, or Firm—Kenyon & Kenyon

(57) ABSTRACT

Two parts which form a device and are joined together according to the related art are joined in a complex manner and require additional elements to produce a tight joint.

A device (1) is described which has two parts (3, 6), has welding pockets (9) which are capable of receiving material during the welding operation for producing a joint.

8 Claims, 2 Drawing Sheets

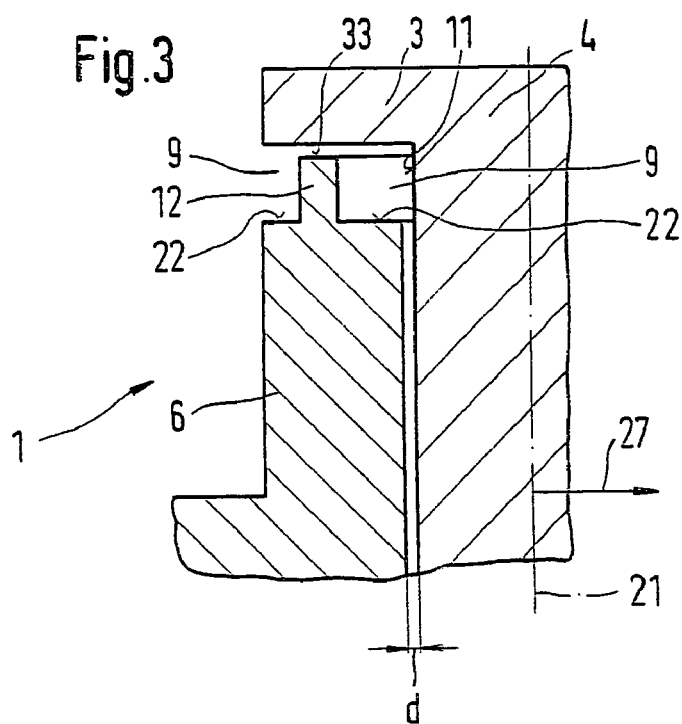
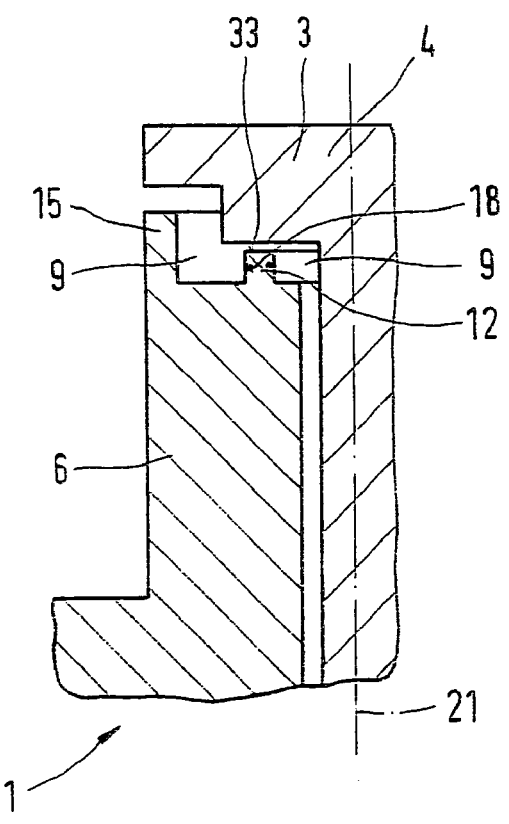
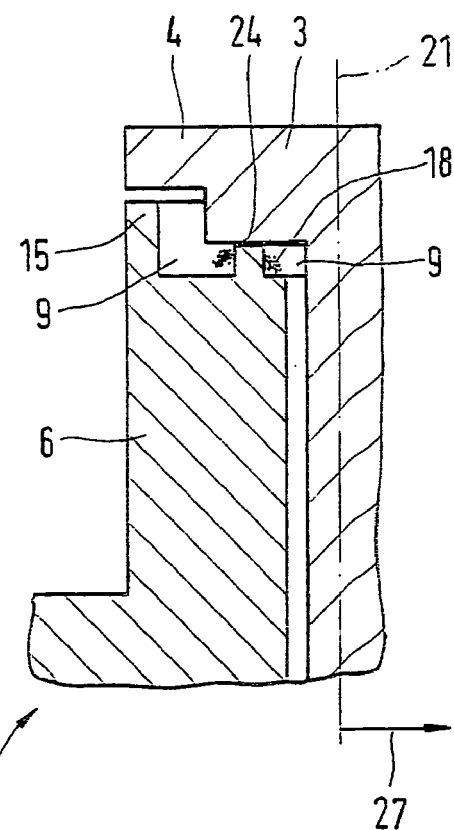

DEVICE CONSISTING AT LEAST OF TWO PARTS JOINED TOGETHER

BACKGROUND INFORMATION

The present invention is directed to a device according to the preamble of claim 1.

Joining two parts by a threaded joint is generally known. Thus, for example, an insertion probe of a device for determining a parameter of a medium flowing in the duct is placed in a duct at least partially by being screwed onto a wall of the duct. In addition, further sealing elements such as rubber rings for example must be present on the insertion probe to seal the duct outward. Screwing in is an additional process step after the installation of the insertion probe in the duct. In addition, a further component, namely the sealing element, must be installed. Such a device is shown in U.S. Pat. No. 5,804,718, for example.

ADVANTAGES OF THE INVENTION

The device according to the present invention having the characterizing features of claim 1 has the advantage over the related art that a joint, which is moisture- and air-tight without additional means, is easily established between two parts.

The presence of welding pockets when two parts are welded together is advantageous, because material from at least one of the parts enters the welding pocket and is thus unable to affect the joining process between the two parts. In addition, the material which flows or is deformed during the welding operation cannot reach the environment because it is held in the welding pocket.

The at least one welding pocket may advantageously be present on one or on both parts. Furthermore, the interaction of the two parts may also result in the formation of an advantageous welding pocket.

It is advantageous if a second part has a first projection, on which the first part rests during welding, because a defined welding pocket which produces a tight joint between the parts is thus produced.

It is advantageous if the parts are joined by orbital vibration welding, because this method subjects the parts and/or components situated on the parts to less thermal and mechanical stress compared to ultrasound welding. Thus, for example, a heat-sensitive and/or vibration-sensitive electronic component may be placed on at least one part before the welding operation without being damaged by the welding operation.

DRAWING

Exemplary embodiments of the present invention are schematically represented in the drawing and explained in detail in the description that follows.

FIG. 3 shows a device designed according to the present invention having a first projection;

FIG. 4a shows a device designed according to the present invention having a second projection; and FIG. 4b shows a device shows in which the two parts are welded together.

DETAILED DESCRIPTION OF THE EXEMPLARY EMBODIMENTS

Figure 1:
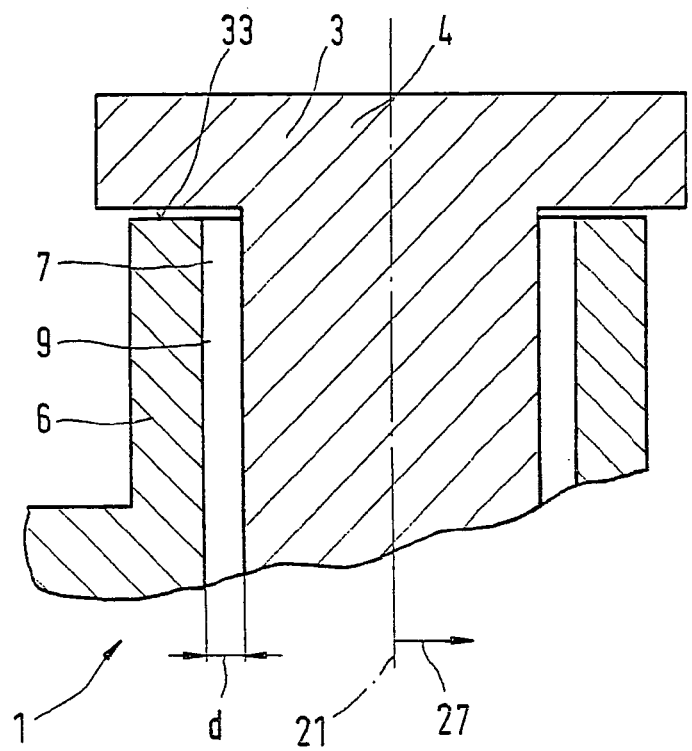
FIG. 1 shows a first exemplary embodiment of a device designed according to the present invention.

FIG. 1 shows a first part 3 and a second part 6 of a device 1 designed according to the present invention.

The two parts 3, 6 are welded together.

Device 1 has, for example, a duct forming second part 6 and an insertion probe 3 forming first part 3, which is inserted into the duct through an insertion opening 7, at least one parameter of a medium flowing in the duct being determined using a sensor in insertion probe 3. Such a device is known, for example, from German Patent Application 198 27 375 A1 and should be part of this disclosure.

Parts 3, 6 are made, for example, but not necessarily, of plastic and have a central axis 21, for example. One axial end 4 of first part 3 is designed with a T-shaped cross section, for example. First part 3 is situated at least partially in second part 6, for example, and rests on second part 6, part 6 having a tubular design in the area of T-shaped end 4 of part 3.

In a radial direction 27 between first part 3 and second part 6, there is a distance d different from zero, whereby a cavity acting as a welding pocket 9 is formed between first part 3 and second part 6.

During the welding operation, material may be eroded from or pressed off at a contact surface 33 between T-shaped end 4 of first part 3 and second part 6. This material enters the at least one welding pocket 9 and no longer interferes with the welding operation between first part 3 and second part 6.

Vibration welding, in particular orbital vibration welding, which is based on friction heating and plasticizing of parts 3, 6 in the area of contact surface 33, by may be used as the welding process. It is carried out via a unidimensional, oscillating or biaxial relative motion having adjustable amplitudes of 0.25 to 2.5 mm and frequencies between 80 and 300 Hz, for example, under a simultaneously acting pressure of P=0.5 to 8.0 MPa exerted perpendicularly to contact surface 33.

Figure 2A:
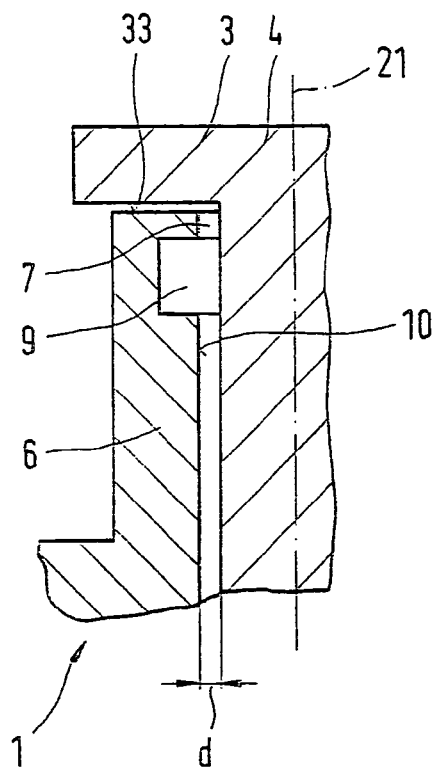
FIG. 2, show two additional exemplary embodiments of a device 2a, 2b designed according to the present invention.

FIG. 2a shows an additional exemplary embodiment of a device 1 designed according to the present invention.

Welding pocket 9 is formed, for example, only on second part 6 by introducing a depression in an inner wall 10 of second part 6 in the proximity of contact surface 33 to form welding pocket 9.

Figure 2B:
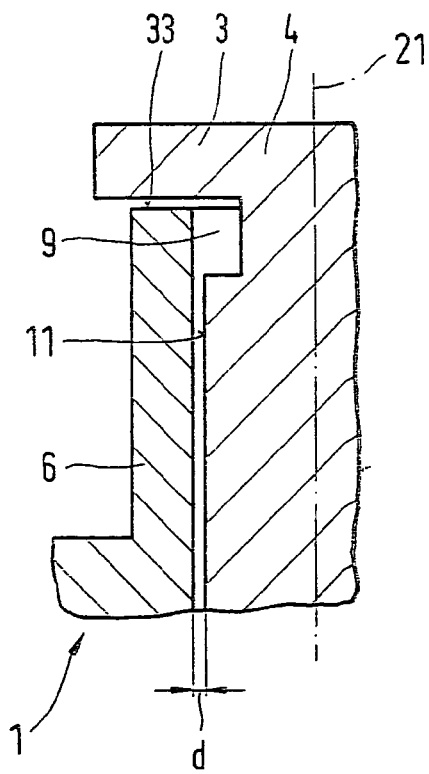

This depression to form welding pocket 9 may also be only on first part 3 in an outer wall 11 in the proximity of contact surface 33 (FIG. 2b). Distance d in the radial direction between first part 3 and second part 6 may then be zero or very small.

FIG. 3 shows an additional exemplary embodiment of a device 1 designed according to the present invention.

Second part 6 has a first projection 12, which extends in the axial direction, i.e., runs parallel to central axis 21 and has contact surface 33 at an axial end. First projection 12 extends centrally, for example, from a base surface 22 of part 6.

Welding pocket 9 is delimited in radial direction 27 by first projection 12 and an outer wall 11 of first part 3, which is opposite first projection 12 in radial direction 27. In axial direction 21, welding pocket 9 is delimited by base surface 22 of part 6 and the T head of axial end 4 of part 3.

The space facing outward in radial direction 27 of first projection 12 also forms a welding pocket 9.

FIG. 4a shows an additional exemplary embodiment of a device 1 designed according to the present invention.

Second part 6 has a second projection 15, which is situated on the outer radial edge of second part 6, i.e., on the outside opposite first projection 12 in radial direction 27 and extends in axial direction 21. Contact surface 33 of second part 6 with first part 3 is formed on first projection 12 and not on second projection 15. During the welding operation, the axial end of first projection 12 and first part 3 in the area of contact surface 33 are heated and plasticized, so that material 18 enters welding pockets 9 radially inward and outward.

Part 18 of first projection 12 which is deformed is identified by cross-hatching.

FIG. 4*b* shows the two parts 3, 6 of a device 1 designed according to the present invention when welded together.

Contact surface 33 forms a sealing surface 24 against air and moisture.

Second projection 15 of second part 6 may, but does not need to, rest on first part 3 and prevents material 18, which is present in outer welding pocket 9, from escaping out of outer welding pocket 9 to the outside.

What is claimed is:

1. A device, comprising:
   at least two parts that are joined together, wherein:
   the at least two parts are welded together,
   at least one welding pocket is present and is capable of receiving material of at least one of the at least two parts that is displaced when the at least two parts are welded together,
   one of the at least two parts includes a first projection extending in an axial direction parallel to a central axis of the at least two parts and having a contact surface at an axial end, another one of the at least two parts rests on the contact surface of the first projection, the two parts welded together at a welding spot in an area of the contact surface, and
   one of the at least two parts is situated at least partially in another one of the at least two parts, the another one of the at least two parts in which the one of the at least two parts is situated includes the first projection and a second projection that surrounds a welding spot at the first projection in a radial circumferential direction and that extends in the axial direction.

2. The device as recited in claim 1, wherein:
the device is for determining at least one parameter of a medium flowing in a duct.

3. The device as recited in claim 1, wherein:
at least one of the at least two parts includes the at least one welding pocket.

4. The device as recited in claim 1, wherein:
the at least one welding pocket is formed by the at least two parts.

5. The device as recited in claim 1, wherein:
a tight joint exists between the at least two parts due to the welding.

6. The device as recited in claim 1, wherein:
the at least two parts are welded together by vibration welding.

7. The device as recited in claim 6, wherein:
the vibration welding includes orbital vibration welding.

8. The device as recited in claim 6, wherein:
one of the at least two parts includes at least one of a heat-sensitive electronic component and a vibration-sensitive electronic component.

* * * * *

UNITED STATES PATENT AND TRADEMARK OFFICE
CERTIFICATE OF CORRECTION

PATENT NO.       : 7,024,943 B2
APPLICATION NO.  : 10/398599
DATED            : April 11, 2006
INVENTOR(S)      : Roeckel et al.

It is certified that error appears in the above-identified patent and that said Letters Patent is hereby corrected as shown below:

On the Title of the Item, #(57) under the heading "ABSTRACT", close up lines 3 and 4 so there is no space between them.

On the Title of the Item, #(57) under the heading "ABSTRACT", line 4, delete "(1)"

On the Title of the Item, #(57) under the heading "ABSTRACT", line 4, delete "(3,6)"

On the Title of the Item, #(57) under the heading "ABSTRACT", line 5, delete "(9)"

Column 1, line 4, change "BACKGROUND INFORMATION" to --FIELD OF THE INVENTION--

Column 1, lines 6-7, delete "according to the preamble of claim 1"

Column 1, line 8, insert heading "BACKGROUND INFORMATION"

Column 1, line 20, change "ADVANTAGES OF THE INVENTION" to --SUMMARY OF THE INVENTION--

Column 1, line 22-23, delete "having the characterizing features of claim 1"

Column 1, line 52, change "DRAWING" to --BRIEF DESCRIPTION OF THE DRAWINGS--

Column 1, lines 54-56, delete "Exemplary embodiments of the present invention are schematically represented in the drawing and explained in detail in the description that follows."

Column 1, line 60, change "FIG. 2 shows two additional exemplary embodiments" to --FIG. 2a shows another exemplary embodiment device--

Column 1, line 61, delete "(2a, 2b)"

UNITED STATES PATENT AND TRADEMARK OFFICE
CERTIFICATE OF CORRECTION

PATENT NO. : 7,024,943 B2
APPLICATION NO. : 10/398599
DATED : April 11, 2006
INVENTOR(S) : Roeckel et al.

It is certified that error appears in the above-identified patent and that said Letters Patent is hereby corrected as shown below:

Column 1, line 61, insert --FIG. 2b shows another exemplary embodiment of a device designed according to the present invention.--

Column 2, lines 1-2, delete "OF THE EXEMPLARY EMBODIMENTS"

Signed and Sealed this

Twenty-fifth Day of December, 2007

JON W. DUDAS
*Director of the United States Patent and Trademark Office*